United States Patent
Rajagopalan et al.

(10) Patent No.: US 7,229,911 B2
(45) Date of Patent: Jun. 12, 2007

(54) ADHESION IMPROVEMENT FOR LOW K DIELECTRICS TO CONDUCTIVE MATERIALS

(75) Inventors: Nagarajan Rajagopalan, Santa Clara, CA (US); Meiyee Shek, Mountain View, CA (US); Albert Lee, Cupertino, CA (US); Annamalai Lakshmanan, Santa Clara, CA (US); Li-Qun Xia, Santa Clara, CA (US); Zhenjiang Cui, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/929,884

(22) Filed: Aug. 30, 2004

(65) Prior Publication Data

US 2006/0046479 A1    Mar. 2, 2006

Related U.S. Application Data

(63) Continuation-in-part of application No. 10/828,023, filed on Apr. 19, 2004.

(51) Int. Cl.
*H01L 21/4763* (2006.01)

(52) U.S. Cl. ............ 438/624; 438/628; 438/629; 438/630; 438/634; 438/649; 438/687; 438/798; 257/E21.081

(58) Field of Classification Search ............ 438/623, 438/624, 629, 630, 634, 649, 664, 672, 680, 438/682, 694, 906, 902, 687, 798; 257/E21.081
See application file for complete search history.

(56) References Cited

U.S. PATENT DOCUMENTS

| | | | |
|---|---|---|---|
| 3,510,369 | A | 5/1970 | Emick et al. |
| 4,262,631 | A | 4/1981 | Kubacki |
| 4,308,089 | A | 12/1981 | Iida et al. |
| 4,420,386 | A | 12/1983 | White |
| 4,436,761 | A | 3/1984 | Hayashi et al. |

(Continued)

FOREIGN PATENT DOCUMENTS

DE        41 26 759        2/1993

(Continued)

OTHER PUBLICATIONS

Hymes, et al., "Thermal Stability of Copper Silicide Passivation Layers in Copper-Based Multilevel Interconnects," Journal of Applied Physics, vol. 83, No. 8. Apr. 15, 1998. pp. 4507-4512.

(Continued)

*Primary Examiner*—George Fourson
*Assistant Examiner*—Julio J. Maldonado
(74) *Attorney, Agent, or Firm*—Patterson and Sheridan

(57) ABSTRACT

Methods are provided for processing a substrate for depositing an adhesion layer between a conductive material and a dielectric layer. In one aspect, the invention provides a method for processing a substrate including positioning a substrate having a conductive material disposed thereon, introducing a reducing compound or a silicon based compound, exposing the conductive material to the reducing compound or the silicon based compound, and depositing a silicon carbide layer without breaking vacuum.

9 Claims, 3 Drawing Sheets

U.S. PATENT DOCUMENTS

| | | |
|---|---|---|
| 4,532,150 A | 7/1985 | Endo et al. |
| 4,634,601 A | 1/1987 | Hamakawa et al. |
| 4,759,947 A | 7/1988 | Ishihara |
| 4,872,947 A | 10/1989 | Wang et al. |
| 4,894,352 A | 1/1990 | Lane et al. |
| 4,895,734 A | 1/1990 | Yoshida et al. |
| 4,951,601 A | 8/1990 | Maydan et al. |
| 4,980,196 A | 12/1990 | Yasuda et al. |
| 4,994,410 A | 2/1991 | Sun et al. |
| 5,000,113 A | 3/1991 | Wang et al. |
| 5,003,178 A | 3/1991 | Livesay |
| 5,011,706 A | 4/1991 | Tarhay et al. |
| 5,086,014 A | 2/1992 | Miyata et al. |
| 5,121,706 A | 6/1992 | Nichols et al. |
| 5,135,775 A | 8/1992 | Foller et al. |
| 5,224,441 A | 7/1993 | Felts et al. |
| 5,232,871 A | 8/1993 | Ho |
| 5,232,872 A | 8/1993 | Ohba |
| 5,238,866 A | 8/1993 | Bolz et al. |
| 5,242,530 A | 9/1993 | Batey et al. |
| 5,288,527 A | 2/1994 | Jousse et al. |
| 5,298,597 A | 3/1994 | Yuo et al. |
| 5,360,491 A | 11/1994 | Carey et al. |
| 5,405,492 A * | 4/1995 | Moslehi ................. 438/694 |
| 5,409,543 A | 4/1995 | Panitz et al. |
| 5,420,044 A | 5/1995 | Kozuka |
| 5,441,768 A | 8/1995 | Law et al. |
| 5,447,887 A | 9/1995 | Filipiak et al. |
| 5,451,263 A | 9/1995 | Linn et al. |
| 5,458,907 A | 10/1995 | Ishido |
| 5,465,680 A | 11/1995 | Loboda |
| 5,468,978 A | 11/1995 | Dowben |
| 5,480,300 A | 1/1996 | Okoshi et al. |
| 5,494,712 A | 2/1996 | Hu et al. |
| 5,554,570 A | 9/1996 | Maeda et al. |
| 5,565,084 A | 10/1996 | Lee et al. |
| 5,591,566 A | 1/1997 | Ogawa |
| 5,599,736 A | 2/1997 | Tseng |
| 5,607,773 A | 3/1997 | Ahlburn et al. |
| 5,628,828 A | 5/1997 | Kawamura et al. |
| 5,638,251 A | 6/1997 | Goel et al. |
| 5,641,607 A | 6/1997 | Ogawa et al. |
| 5,643,834 A | 7/1997 | Harada et al. |
| 5,658,834 A | 8/1997 | Dowben |
| 5,691,209 A | 11/1997 | Liberkowski |
| 5,710,067 A | 1/1998 | Foote et al. |
| 5,711,987 A | 1/1998 | Bearinger et al. |
| 5,725,938 A | 3/1998 | Jin et al. |
| 5,726,097 A | 3/1998 | Yanagida |
| 5,730,792 A | 3/1998 | Camilletti et al. |
| 5,736,002 A | 4/1998 | Allen et al. |
| 5,741,626 A | 4/1998 | Jain et al. |
| 5,776,235 A | 7/1998 | Camilletti et al. |
| 5,780,163 A | 7/1998 | Camilletti et al. |
| 5,789,316 A | 8/1998 | Lu |
| 5,789,776 A | 8/1998 | Lancaster et al. |
| 5,801,098 A | 9/1998 | Fiordalice et al. |
| 5,817,579 A | 10/1998 | Ko et al. |
| 5,818,071 A | 10/1998 | Loboda et al. |
| 5,834,371 A | 11/1998 | Ameen et al. |
| 5,843,847 A | 12/1998 | Pu et al. |
| 5,855,681 A | 1/1999 | Maydan et al. |
| 5,866,213 A | 2/1999 | Foster et al. |
| 5,869,396 A | 2/1999 | Pan et al. |
| 5,876,891 A | 3/1999 | Takimoto et al. |
| 5,899,720 A | 5/1999 | Mikagi |
| 5,926,740 A | 7/1999 | Forbes et al. |
| 5,950,083 A | 9/1999 | Inoue et al. |
| 5,970,378 A | 10/1999 | Shue et al. |
| 5,975,912 A | 11/1999 | Hillman et al. |
| 5,989,998 A | 11/1999 | Sugahara et al. |
| 6,013,574 A | 1/2000 | Hause et al. |
| 6,033,537 A | 3/2000 | Suguro |
| 6,051,321 A | 4/2000 | Lee et al. |
| 6,054,379 A | 4/2000 | Yau et al. |
| 6,057,251 A | 5/2000 | Goo et al. |
| 6,060,132 A | 5/2000 | Lee |
| 6,068,884 A | 5/2000 | Rose et al. |
| 6,071,809 A | 6/2000 | Zhao |
| 6,071,813 A | 6/2000 | Nogami |
| 6,072,227 A | 6/2000 | Yau et al. |
| 6,080,526 A | 6/2000 | Yang et al. |
| 6,107,192 A | 8/2000 | Subrahmanyan et al. |
| 6,140,226 A | 10/2000 | Grill et al. |
| 6,143,128 A | 11/2000 | Ameen et al. |
| 6,143,640 A | 11/2000 | Cronin et al. |
| 6,147,009 A | 11/2000 | Grill et al. |
| 6,159,871 A | 12/2000 | Loboda et al. |
| 6,169,039 B1 | 1/2001 | Lin et al. |
| 6,172,421 B1 | 1/2001 | Besser et al. |
| 6,174,810 B1 | 1/2001 | Islam et al. |
| 6,242,339 B1 | 6/2001 | Aoi |
| 6,242,530 B1 | 6/2001 | Konig et al. |
| 6,251,775 B1 | 6/2001 | Armbrust et al. |
| 6,287,990 B1 | 9/2001 | Cheung et al. |
| 6,291,334 B1 | 9/2001 | Somekh |
| 6,303,505 B1 | 10/2001 | Ngo et al. |
| 6,303,523 B2 | 10/2001 | Cheung et al. |
| 6,312,793 B1 | 11/2001 | Grill et al. |
| 6,316,167 B1 | 11/2001 | Angelopoulos et al. |
| 6,319,728 B1 | 11/2001 | Bhan et al. |
| 6,340,435 B1 | 1/2002 | Bjorkman et al. |
| 6,340,628 B1 | 1/2002 | Van Cleemput et al. |
| 6,344,693 B1 | 2/2002 | Kawahara et al. |
| 6,348,725 B2 | 2/2002 | Cheung et al. |
| 6,352,945 B1 | 3/2002 | Matsuki et al. |
| 6,355,571 B1 | 3/2002 | Huang et al. |
| 6,365,527 B1 | 4/2002 | Yang et al. |
| 6,383,955 B1 | 5/2002 | Matsuki et al. |
| 6,410,462 B1 | 6/2002 | Yang et al. |
| 6,410,463 B1 | 6/2002 | Matsuki |
| 6,413,583 B1 | 7/2002 | Moghadam et al. |
| 6,432,846 B1 | 8/2002 | Matsuki |
| 6,436,824 B1 | 8/2002 | Chooi et al. |
| 6,437,443 B1 | 8/2002 | Grill et al. |
| 6,444,136 B1 | 9/2002 | Liu et al. |
| 6,444,568 B1 | 9/2002 | Sundararajan et al. |
| 6,455,445 B2 | 9/2002 | Matsuki |
| 6,465,366 B1 | 10/2002 | Nemani et al. |
| 6,479,110 B2 | 11/2002 | Grill et al. |
| 6,500,773 B1 | 12/2002 | Gaillard et al. |
| 6,511,903 B1 | 1/2003 | Yau et al. |
| 6,511,909 B1 | 1/2003 | Yau et al. |
| 6,532,150 B2 | 3/2003 | Sivertsen et al. |
| 6,537,733 B2 | 3/2003 | Campana et al. |
| 6,537,929 B1 | 3/2003 | Cheung et al. |
| 6,541,282 B1 | 4/2003 | Cheung et al. |
| 6,548,690 B2 | 4/2003 | Mimoun |
| 6,548,899 B2 | 4/2003 | Ross |
| 6,555,476 B1 | 4/2003 | Olsen et al. |
| 6,562,690 B1 | 5/2003 | Cheung et al. |
| 6,573,193 B2 | 6/2003 | Yu et al. |
| 6,573,196 B1 | 6/2003 | Gaillard et al. |
| 6,582,777 B1 | 6/2003 | Ross et al. |
| 6,583,048 B1 | 6/2003 | Vincent et al. |
| 6,592,890 B1 | 7/2003 | Green |
| 6,593,247 B1 | 7/2003 | Huang et al. |
| 6,593,633 B2 | 7/2003 | Jan et al. |
| 6,593,653 B2 | 7/2003 | Sundararajan et al. |
| 6,593,655 B1 | 7/2003 | Loboda et al. |
| 6,596,655 B1 | 7/2003 | Cheung et al. |

| | | | |
|---|---|---|---|
| 6,624,053 B2 | 9/2003 | Passemard |
| 6,627,532 B1 | 9/2003 | Gaillard et al. |
| 6,649,531 B2 | 11/2003 | Cote et al. |
| 6,660,656 B2 | 12/2003 | Cheung et al. |
| 6,660,663 B1 | 12/2003 | Cheung et al. |
| 6,730,593 B2 | 5/2004 | Yau et al. |
| 6,734,115 B2 | 5/2004 | Cheung et al. |
| 6,764,958 B1 | 7/2004 | Nemani et al. |
| 6,790,788 B2 | 9/2004 | Li et al. |
| 6,818,557 B1 * | 11/2004 | Ngo et al. | 438/687 |
| 6,869,873 B2 * | 3/2005 | Bradshaw et al. | 438/630 |
| 6,879,046 B2 * | 4/2005 | Gibson et al. | 257/760 |
| 2002/0000670 A1 | 1/2002 | Yau et al. |
| 2002/0045361 A1 | 4/2002 | Cheung et al. |
| 2002/0093075 A1 | 7/2002 | Gates et al. |
| 2002/0111042 A1 | 8/2002 | Yau et al. |
| 2002/0119250 A1 | 8/2002 | Campana et al. |
| 2002/0155386 A1 | 10/2002 | Xu et al. |
| 2002/0160626 A1 | 10/2002 | Matsuki et al. |
| 2002/0172766 A1 | 11/2002 | Laxman et al. |
| 2003/0001282 A1 | 1/2003 | Meynen et al. |
| 2003/0003765 A1 | 1/2003 | Gibson, Jr. et al. |
| 2003/0003768 A1 | 1/2003 | Cho et al. |
| 2003/0040195 A1 | 2/2003 | Chang et al. |
| 2003/0042605 A1 | 3/2003 | Andideh et al. |
| 2003/0064154 A1 | 4/2003 | Laxman et al. |
| 2003/0068881 A1 | 4/2003 | Xia et al. |
| 2003/0089988 A1 | 5/2003 | Matsuura |
| 2003/0111730 A1 | 6/2003 | Takeda et al. |
| 2003/0129827 A1 | 7/2003 | Lee et al. |
| 2003/0134499 A1 * | 7/2003 | Chen et al. | 438/618 |
| 2003/0139035 A1 | 7/2003 | Yim et al. |
| 2003/0194496 A1 | 10/2003 | Xu et al. |
| 2004/0067308 A1 | 4/2004 | Zheng et al. |
| 2004/0134499 A1 * | 7/2004 | Sabbagh | 128/859 |

FOREIGN PATENT DOCUMENTS

| | | |
|---|---|---|
| DE | 195 21 150 | 12/1995 |
| DE | 196 54 737 | 12/1996 |
| DE | 197 51 785 | 5/1998 |
| DE | 197 02 124 | 7/1998 |
| DE | 197 17 698 | 10/1998 |
| DE | 199 04 311 | 8/1999 |
| EP | 0 416 400 | 3/1991 |
| EP | 0 613 178 | 2/1994 |
| EP | 0 630 989 | 12/1994 |
| EP | 0 684 671 | 11/1995 |
| EP | 0 725 440 | 8/1996 |
| EP | 0 780 485 | 6/1997 |
| EP | 0 849 779 | 6/1998 |
| EP | 0 935 283 | 8/1999 |
| EP | 0 029 728 | 8/2000 |
| EP | 1 107 303 | 6/2001 |
| EP | 1 122 770 | 8/2001 |
| EP | 1 176 226 | 1/2002 |
| FR | 2 775 986 | 9/1999 |
| GB | 2 155 862 | 10/1985 |
| GB | 2 290 166 | 12/1995 |
| GB | 2 319 532 | 5/1998 |
| GB | 2 319 533 | 5/1998 |
| GB | 2 390 742 | 1/2004 |
| JP | 61-09579 | 1/1986 |
| JP | 62 158 859 | 7/1987 |
| JP | 11-16912 | 5/1989 |
| JP | 04-072724 | 3/1992 |
| JP | 04-273442 | 9/1992 |
| JP | 06-097111 | 4/1994 |
| JP | 06-204191 | 7/1994 |
| JP | 7-201749 | 4/1995 |
| JP | 07-201738 | 8/1995 |
| JP | 09-008031 | 1/1997 |
| JP | 09 320 075 | 12/1997 |
| WO | WO 93/17453 | 9/1993 |
| WO | WO 99/33102 | 7/1999 |
| WO | WO 99/41423 | 8/1999 |
| WO | WO 00/19498 | 4/2000 |
| WO | WO 00/19508 | 4/2000 |
| WO | WO 00/20900 | 4/2000 |

OTHER PUBLICATIONS

Hymes, et al. "Surface Cleaning of Copper by Thermal and Plasma Treatment in Reducing and Inert Ambients", 1 Vac. Sci. Technol. vol. 16, No. 3 May/Jun. 1998; pp. 1107-1109.

Kanehiro, et al. "Cleaning of copper or copper alloy for dry coating"; Chemical Abstracts, vol. 107, No. 26, p. 83; Dec. 28, 1987.

"Low Temperature Process for Surface Cleaning", Research Disclosure XP00099373, GB, Industrial Opprotunities Ltd. Havant, No. 309, Jan. 1, 1990, p. 82.

PCT Partial Search Report dated Oct. 25, 2005 for PCT/US05/013313.

PCT International Search Report dated Jun. 18, 2004 for PCT/US04/000374.

PCT Written Opinion dated Jun. 18, 2004 for PCT/US04/000374.

Darchen, et al, "Electrochemical Investigations of Copper Etching by Cu $(NH_3)_4$ $Cl_2$ in Ammoniacal Solutions", Journal of Applied Electrochemistry, 1997, 27 (4), 448-454.

Dijkstra et al., "Optimization of Anti-Reflection Layers for Deep UV Lithography", Proceedings of SPIE Optical/Laser Microlithography, Bellingham, SPIE, vol. 1927, 1993 pp. 275-286.

Fukuda, et al. "Highly Reliable SiOF Film Formation by ECR-CVD Using SiF2H2", Symposium on VLSI Technology Digest of Technical Papers IEEE (1996) pp. 114-115.

Ito, et al, "Direct Thermal Nitridation of Silicon Dioxide Films in Anhydrous Ammonia Gas," J. Electrochem. Soc., vol. 127, No. 9, pp. 2053-2057.

Mikagi, et al, Barrier Metal Free Copper Damascene Interconnection Technology Using Atmospheric Copper Reflow and Nitrogen Doping in SiOF Film, 8 1996 IEEE, IEVM 96, 365-368, pp. 14.5.1-14.5.4.

Ogawa et al., "Novel ARC Optimization Methodology for KrF Excimer Laser Lithography at Low K1 Factor", Proceedings of the SPIE. Optical/Laser Microlithography V, vol. 1674, 1992, pp. 362-375.

Omar, M.A., "Elementary Solid State Physics: Principles and Applications," Lowell Technological Institute, Addison-Wesley Publishing Company, © 1975, pp. 124, 125.

PCT International Search Report for PCT/US2004/000374, dated Jun. 18, 2004.

PCT Written Opinion for PCT/US2004/000374, dated Jun. 18, 2004.

PCT International Search Report for US02/36229 dated Sep. 3, 2003.

PCT International Search Report for US02/40034 dated May 19, 2003.

PCT International Search Report for US99/22425 dated Feb. 11, 2000.

PCT Partial International Search Report dated Mar. 21, 2000, for US99/22317.

PCT International Search Report dated Jul. 6, 2000, for US99/22317.

Sawada, et al., "The reduction of copper oxide thin films with hydrogen plasma generated by an atmospheric-pressure glow discharge," J. Phys. Appl. Phys. 29 (1996), pp. 2539-2544.

Swope, et al, "Improvement of Adhesion Properties of Fluorinated Silica Glass Films by Nitrous Oxide Plasma Treatment," J. Electrochem. Soc., vol. 144, No. 7, Jul. 1997, pp. 2559-2564.

Takashi Ito, Takao Nozaki, and Hajime Ishikawa, "Direct Thermal Nitridation of Silicon Dioxide Films in Anhydrous Ammonia Gas," J. Electrochem. Soc., vol. 127, No. 9, pp. 2053-2057.

Takeishi, et al, Stabilizing Dielectric Constants of Fluorine-Doped SiO$_2$ Films by N$_2$O-Plasma Annealing, J. Electrochem. Soc., vol. 143, No. 1, Jan. 1996, pp. 381-384.

Takewaki, et al, "A Novel Self-Aligned Surface-Silicide Passivation Technology for Reliability Enhancement in Copper Interconnects", 1995 Symposium on VLSI Technology Digest of Technical Papers, pp. 31-32.

U.S. Appl. No. 09/270,039, filed on Mar. 16, 1999, Huang.

V. Cech, et al. "Thin Plasma-Polymerized Films of Dichloro(Methyl)Phenylsilane" Czechoslovak Journal of Physics, vol. 50 (2000), Suppl. S3 pp. 356-364.

Written Opinion, for US99/22424, dated Apr. 5, 2001.

Wong, et al, "Low Pressure Nitrided-Oxide as a Thin Gate Dielectric for MOSEFTI's," vol. 130, No. 5, pp. 1139-1144.

Wu, et al., "Advanced Metal Barrier Free Cu Damascene Interconnects with PECVD Silicon Carbide Barriers for 90/65-nm BEOL Technology", 2002 IEEE, IEDM pp. 595-598.

PCT International Search Report for PCT/US05/013313 dated Nov. 29, 2005.

PCT Written Opinion for PCT/US05/013313 dated Nov. 29, 2005.

\* cited by examiner

ADHESION IMPROVEMENT FOR LOW K DIELECTRICS TO CONDUCTIVE MATERIALS

CROSS-REFERENCE TO RELATED APPLICATIONS

This application is a continuation-in-part of co-pending U.S. patent application Ser. No. 10/828,023, filed Apr. 19, 2004.

BACKGROUND OF THE DISCLOSURE

1. Field of the Invention

The invention relates to the fabrication of integrated circuits and to a process for depositing dielectric layers on a substrate and the structures formed by the dielectric layer.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional thermal CVD processes supply reactive gases to the substrate surface where heat-induced chemical reactions take place to produce a desired layer.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 μm and even 0.18 μm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constant<4.0) to also reduce the capacitive coupling between adjacent metal lines. One such low k dielectric material is spin-on glass, such as un-doped silicon glass (USG) or fluorine-doped silicon glass (FSG), which can be deposited as a gap fill layer in a semiconductor manufacturing process. Another low k dielectric material is silicon oxycarbide that can used as a dielectric layer in fabricating damascene features.

One conductive material gaining acceptance is copper and its alloys, which have become the materials of choice for sub-quarter-micron interconnect technology because copper has a lower resistivity than aluminum, (1.7 μΩ-cm compared to 3.1 μΩ-cm for aluminum), a higher current and higher carrying capacity. These characteristics are important for supporting the higher current densities experienced at high levels of integration and increased device speed. Further, copper has good thermal conductivity and is available in a very pure state.

One difficulty in using copper in semiconductor devices is that copper is difficult to etch to achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e. vias, and horizontal interconnects, i.e., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, are then removed and a planarized surface is formed. A dielectric layer, such as an insulative layer or barrier layer is formed over the copper feature for subsequent processing, such as forming a second layer of damascene structures.

However, it has been observed that between the copper planarization and the subsequent dielectric layer deposition, the copper material may be subjected to an oxidation reaction through exposure between processing chambers or processing tools. The exposure to an oxidizing environment results in the formation of surface oxides on the copper material. The oxides inhibit the adhesion of subsequent layers, for example, the dielectric layer, that are deposited thereover.

Therefore, there remains a need for a process for improving interlayer adhesion between low k dielectric layers.

SUMMARY OF THE INVENTION

Aspects of the invention generally provide a method for depositing an adhesion layer between a conductive material and a dielectric layer. In one aspect, the invention provides a method for processing a substrate including positioning the substrate in a processing chamber, wherein the substrate comprises one or more patterned low k dielectric layers and a conductive material formed therein, introducing a silicon based compound into the processing chamber, forming a suicide layer of the conductive material, and depositing a silicon carbide layer on the suicide layer without breaking vacuum.

In another aspect of the invention, a method is provided for processing a substrate including positioning the substrate in a processing chamber, wherein the substrate comprises one or more patterned low k dielectric layers and a conductive material formed therein, introducing a silicon based compound and reducing compound into the processing chamber, forming a silicide layer of the conductive material, initiating a plasma of the silicon based compound and reducing compound, depositing a silicon nitride layer, and depositing a silicon carbide layer on the silicon nitride layer without breaking vacuum.

In another aspect of the invention, a method is provided for processing a substrate including positioning the substrate in a processing chamber, wherein the substrate comprises one or more patterned low k dielectric layers and a conductive material formed therein, introducing a reducing compound comprising nitrogen and hydrogen into the processing chamber, initiating a plasma of the reducing compound in the processing chamber, exposing the conductive material to the plasma of the reducing compound, introducing an organosilicon precursor in the processing chamber, reacting the organosilicon precursor with the reducing compound, depositing a nitrogen doped silicon carbide dielectric material on the one or more patterned low k dielectric layers and conductive material, and depositing a silicon carbide layer on the doped silicon carbide layer without breaking vacuum.

In another aspect of the invention, a method is provided for processing a substrate including positioning the substrate in a processing chamber, wherein the substrate comprises one or more patterned low k dielectric layers and a conductive material formed therein, introducing a reducing compound comprising nitrogen and hydrogen into the processing chamber, initiating a first plasma of the reducing compound in the processing chamber, exposing the conductive material to the plasma of the reducing compound, terminating the first plasma and reducing compound, introducing an organosilicon precursor in the processing chamber, initiating a second plasma of the organosilicon precursor in the processing chamber, introducing the reducing compound with the organosilicon compound, and depositing a nitrogen doped silicon carbide dielectric material on the one or more patterned low k dielectric layers and conductive material without breaking vacuum.

In another aspect of the invention, a method is provided for processing a substrate including positioning the substrate in a processing chamber, wherein the substrate comprises one or more patterned low k dielectric layers and a conductive material formed therein, introducing a reducing compound comprising nitrogen and hydrogen at a first flow rate into the processing chamber, initiating a first plasma of the reducing compound in the processing chamber, exposing the conductive material to the plasma of the reducing compound, terminating the first plasma, introducing an organosilicon precursor in the processing chamber, introducing the reducing compound at a second flow rate greater than the first flow rate, initiating a second plasma of the organosilicon precursor and the reducing compound in the processing chamber, depositing a carbon doped silicon nitride dielectric material on the one or more patterned low k dielectric layers and conductive material, terminating the second plasma, introducing the organosilicon precursor in the processing chamber, introducing the reducing compound at a third flow rate less than the second flow rate, initiating a third plasma of the organosilicon precursor and the reducing compound in the processing chamber, depositing a nitrogen doped silicon carbide dielectric material on the one or more patterned low k dielectric layers and conductive material without breaking vacuum.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

For a further understanding of aspect of the invention, reference should be made to the ensuing detailed description.

DETAILED DESCRIPTION OF THE PREFERRED EMBODIMENTS

Aspects of the invention described herein refer to a method and apparatus for improving interlayer adhesion of conductive materials to dielectric layers. Improving interlayer adhesion may comprise surface treating a conductive material prior to depositing a subsequent dielectric layer, forming intermediate materials prior to depositing a subsequent dielectric layer, or depositing an intermediate layer with improved adhesion prior to depositing a subsequent dielectric layer. The initiation layer may comprise silicon, carbon, and optionally, oxygen. Preferably, the processes are performed in situ to minimize recontamination and improve substrate throughput.

The words and phrases used herein should be given their ordinary and customary meaning in the art by one skilled in the art unless otherwise further defined. In situ should be broadly construed and includes, but is not limited to, in a given chamber, such as in a plasma chamber, or in a system, such as an integrated cluster tool arrangement, without exposing the material to intervening contamination environments, such as breaking vacuum between process steps or chamber within a tool. An in situ process typically minimizes process time and possible contaminants compared to relocating the substrate to other processing chambers or areas.

While the following description details the use of the interlayer adhesion between a conductive material and a dielectric material for a dual damascene structure, the invention should not be construed or limited to the illustrated examples, as the invention contemplates that other structures formation processes and straight deposition processes may be performed using the adhesion aspects described herein.

Deposition of a Dual Damascene Structure

Figure 1A:
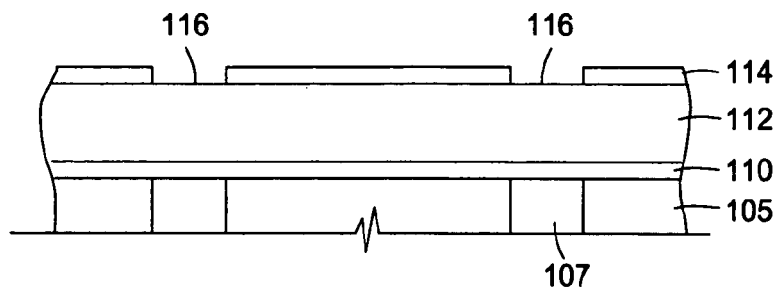
FIG. 1A–1D are cross-sectional views showing one embodiment of a dual damascene deposition sequence of the invention.

As shown in FIG. 1A, a damascene structure that is formed using a substrate 100 having metal features 107 formed in a substrate surface material 105 therein is provided to a processing chamber. A first silicon carbide barrier layer 110 is generally deposited on the substrate surface to eliminate inter-level diffusion between the substrate and subsequently deposited material. Barrier layer materials may have dielectric constants of up to about 9 and preferably between about 2.5 and less than about 4. Silicon carbide barrier layers may have dielectric constants of about 5 or less, preferably less than about 4.

The silicon carbide material of the first silicon carbide barrier layer 110 may be doped with nitrogen and/or oxygen. While not shown, a capping layer of nitrogen free silicon carbide or silicon oxide may be deposited on the barrier layer 110. The nitrogen free silicon carbide or silicon oxide capping layer may be deposited in situ by adjusting the composition of the processing gas. For example, a capping layer of nitrogen free silicon carbide may be deposited in situ on the first silicon carbide barrier layer 110 by minimizing or eliminating the nitrogen source gas. Alternatively, and not shown, an initiation layer may be deposited on the first silicon carbide barrier layer 112. Initiation layers are more fully described in U.S. patent application Ser. No. 10/801,190, filed on Mar. 15, 2004, which is incorporated herein by reference to the extent not inconsistent with the claimed aspects and disclosure herein.

The first dielectric layer 112 is deposited on the silicon carbide barrier layer 110 to a thickness of about 5,000 to about 15,000 Å, depending on the size of the structure to be fabricated, by oxidizing an organosilicon compound, which may include trimethylsilane and/or octamethylcyclotetrasiloxane. The first dielectric layer 112 may then be post-treated with a plasma or e-beam process. Optionally, a silicon oxide cap layer (not shown) may be deposited in situ on the first dielectric layer 112 by increasing the oxygen concentration in the silicon oxycarbide deposition process described herein to remove carbon from the deposited material. The first dielectric layer may also comprise other low k dielectric material such as a low polymer material including paralyne or a low k spin-on glass such as un-doped silicon glass (USG) or fluorine-doped silicon glass (FSG). The first dielectric layer may then be treated by a plasma process as described herein.

An etch stop (or second barrier layer) 114 of a silicon carbide, which may be doped with nitrogen or oxygen, is then deposited on the first dielectric layer 112. The etch stop 114 may be deposited on the first dielectric layer 112 to a thickness of about 100 Å to about 1000 Å. The low k etch stop 114 may be plasma treated as described herein for the silicon carbide materials or silicon oxycarbide materials. The etch stop 114 is then pattern etched to define the openings of the contacts/vias 116 and to expose the first dielectric layer 112 in the areas where the contacts/vias 116 are to be formed. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å to about 500 Å may optionally be deposited on the low k etch stop 114 prior to depositing further materials.

Figure 1B:
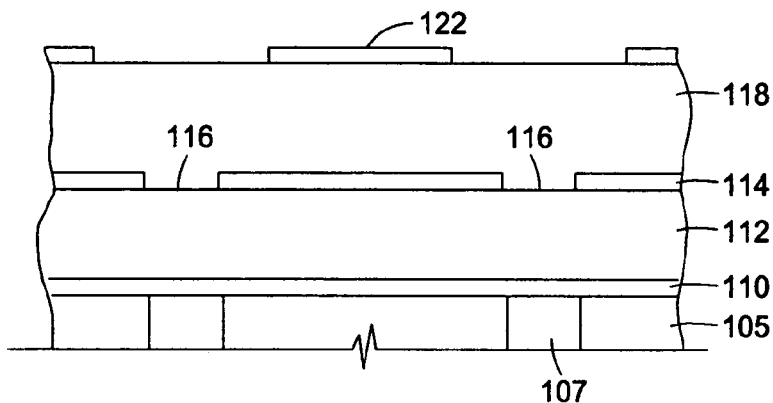

As shown in FIG. 1B, a second dielectric layer 118 of an oxidized organosilane or organosiloxane is then deposited over the patterned etch stop 114 after the resist material has been removed. The second dielectric layer 118 may comprise silicon oxycarbide from an oxidized organosilane or organosiloxane by the process described herein, such as trimethylsilane, is deposited to a thickness of about 5,000 to about 15,000 Å. The second dielectric layer 118 may then be plasma or e-beam treated and/or have a silicon oxide cap material disposed thereon by the process described herein.

Figure 1C:
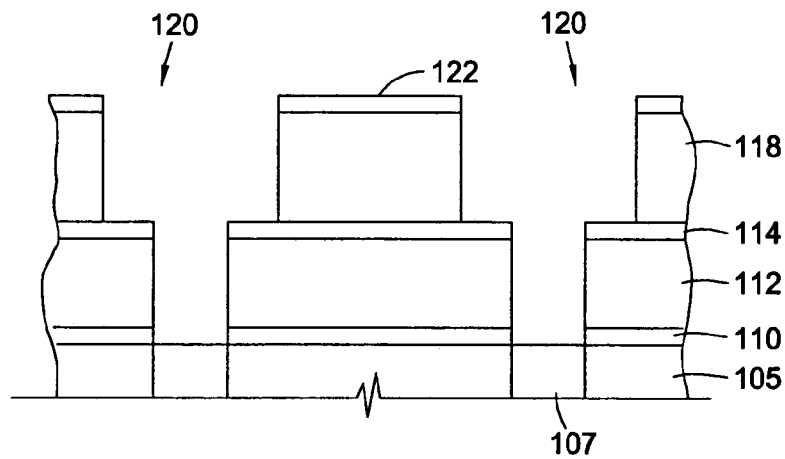

A resist material 122 is then deposited on the second dielectric layer 118 (or cap layer) and patterned preferably using conventional photolithography processes to define the interconnect lines 120 as shown in FIG. 1B. The resist material 122 comprises a material conventionally known in the art, preferably a high activation energy resist material, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 1C. Any resist material or other material used to pattern the etch stop 114 or the second dielectric layer 118 is removed using an oxygen strip or other suitable process.

Figure 1D:
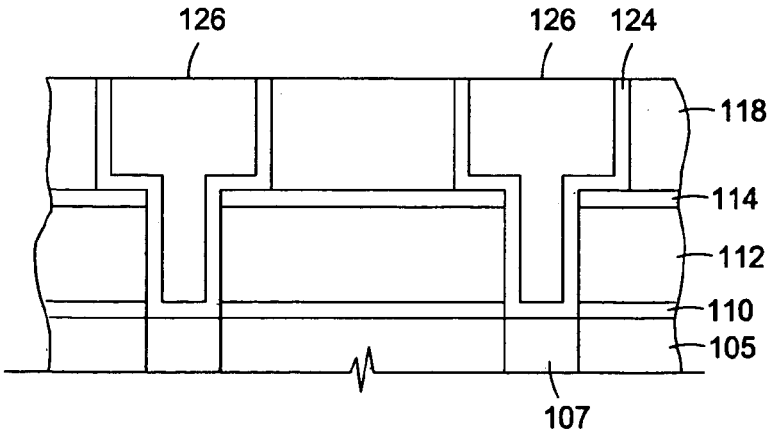

The metallization structure is then formed with a conductive material such as aluminum, copper, tungsten or combinations thereof. Presently, the trend is to use copper to form the smaller features due to the low resistivity of copper (1.7 mΩ-cm compared to 3.1 mΩ-cm for aluminum). Preferably, as shown in FIG. 2G, a suitable metal barrier layer 124, such as tantalum nitride, is first deposited conformally in the metallization pattern to prevent copper migration into the surrounding silicon and/or dielectric material. Thereafter, copper is deposited using either chemical vapor deposition, physical vapor deposition, electroplating, or combinations thereof to form the conductive structure. Once the structure has been filled with copper or other conductive metal, the surface is planarized using chemical mechanical polishing and exposing the surface of the conductive metal feature 126, as shown in FIG. 1D.

Adhesion Process and Dielectric Layer Deposition

In one aspect, interlayer adhesion may be improved by exposing a conductive material to a reacting compound to remove oxides or form a silicide prior to depositing a dielectric layer, such as a silicon carbide layer. The interlayer adhesion improvement and dielectric layer deposition may be performed in situ in the same processing chamber or processing system.

The following deposition processes are described with use of the 300 mm Producer™ dual deposition station processing chamber, and should be interpreted accordingly. For example, flow rates are total flow rates and should be divided by two to describe the process flow rates at each deposition station in the chamber. Additionally, it should be noted that the respective parameters may be modified to perform the plasma processes in various chambers and for different substrate sizes, such as for 200 mm substrates. Further, while the following process is described for copper and silicon carbide, the invention contemplates this process may be used with other conductive materials and dielectric materials used in semiconductor manufacturing.

Figure 2A:
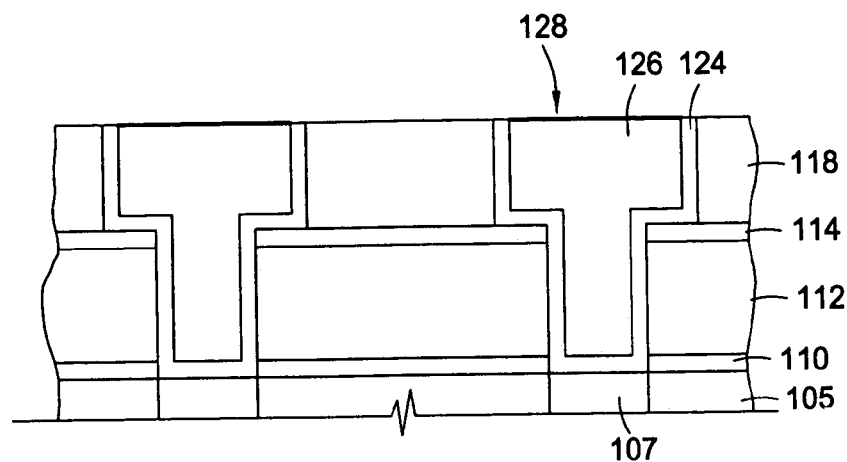
FIGS. 2A–2C are cross-sectional views showing one embodiment of a improved interlayer adhesion sequence of the invention.
Figure 2B:
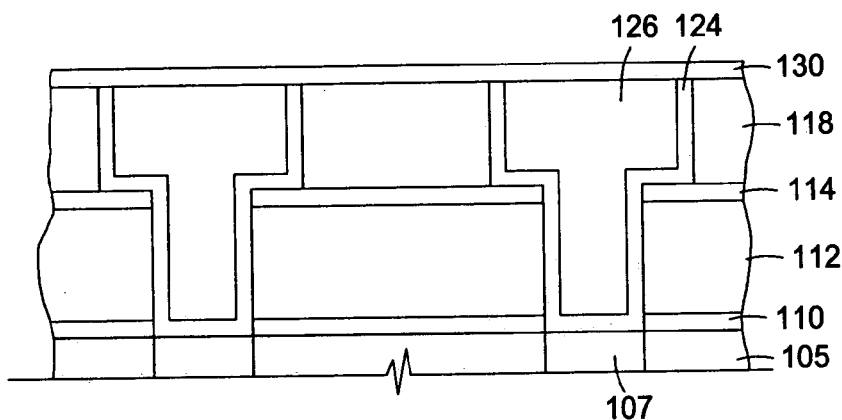
Figure 2C:
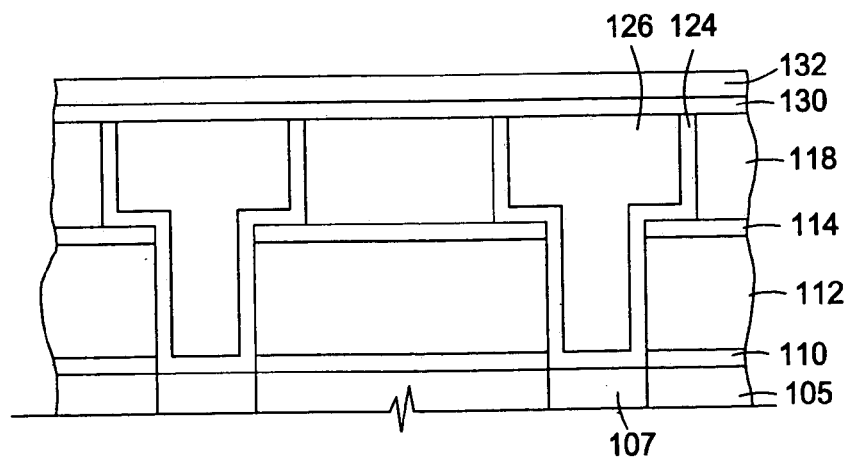

Interlayer adhesion may be improved by introducing a reducing compound of a hydrogen and nitrogen containing precursor into the processing chamber over a substrate having a conductive material to remove any oxides 128 formed therein as shown in FIG. 2A, and then introducing an organosilicon compound to react with the reducing compound to form a nitrated layer 130 as shown on FIG. 2B. Oxides to be removed may also be formed on barrier materials, such as exposed portions of barrier layer 124. The nitrated layer 130 may be continuous or non-continuous over the exposed surface of the substrate. The organosilicon compound is preferably introduced without removing the reducing compound by mechanical exhaustion. The organosilicon compound may be additionally and/or continuously introduced into the processing chamber to form a silicon carbide layer 132 on the nitrated layer as shown in FIG. 2C.

The reducing compound may react with the exposed conductive material by thermally and/or plasma enhanced process. Preferred reducing compounds include hydrogen and nitrogen containing gases, for example, ammonia, a gas mixture of hydrogen ($H_2$) and nitrogen ($N_2$), hydrazine ($N_2H_2$), amines, amine derivatives, or combinations thereof.

One example of a plasma enhanced process with the reducing compound includes providing reducing compounds to a processing chamber at a flow rate between about 50 sccm and about 2000 sccm, for example, between about 100 sccm and about 1600 sccm, optionally providing a nitrogen-containing carrier gas, such as nitrogen, to a processing chamber at a flow rate between about 100 sccm and about 25000 sccm, for example, between about 1000 sccm and about 20000 sccm, maintaining a chamber pressure between about 1 Torr and about 12 Torr, for example, between about 2.5 Torr and about 9 Torr, maintaining a heater temperature between about 100° C. and about 500° C., for example, between about 250° C. and about 450° C., positioning a gas distributor, or "showerhead", between about 200 mils and about 1000 mils, for example between 300 mils and 500 mils, from the substrate surface, and generating a plasma. The plasma treatment may be performed between about 3 seconds and about 120 seconds, for example, between about 5 seconds and about 40 seconds preferably used.

The plasma may be generated by applying a power density ranging between about 0.03 W/cm$^2$ and about 3.2 W/cm$^2$, which is a RF power level of between about 10 W and about 1000 W for a 200 mm substrate, for example, between about 100 W and about 400 W at a high frequency such as between 13 MHz and 14 MHz, for example, 13.56 MHz. The plasma may be generated by applying a power density ranging between about 0.01 W/cm$^2$ and about 1.4 W/cm$^2$, which is a RF power level of between about 10 W and about 1000 W for a 300 mm substrate, for example, between about 100 W and about 400 W at a high frequency such as between 13 MHz and 14 MHz, for example, 13.56 MHz. Alternatively, the plasma may be generated by a dual-frequency RF power source as described herein. Alternatively, all plasma generation may be performed remotely, with the generated radicals introduced into the processing chamber for plasma treatment of a deposited material or deposition of a material layer.

The reducing compound may comprise providing a single component, such as ammonia or hydrazine, to a processing chamber at a flow rate between about 50 sccm and about 3000 sccm, for example, between about 100 sccm and about 2000 sccm. The single component delivery may further include a carrier or inert gas, for example nitrogen, helium, or argon, at a flow rate of between about 100 sccm and about 10000 sccm, for example, between about 1000 sccm and about 5000 sccm. In a multi-component system, such as a mixture of nitrogen gas and hydrogen gas, may be provided to the processing chamber by a process including providing nitrogen to a processing chamber at a flow rate between about 50 sccm and about 5000 sccm, for example, between about 100 sccm and about 1000 sccm, and providing hydrogen to a processing chamber at a flow rate between about 50 sccm and about 5000 sccm, for example, between about 100 sccm and about 1500 sccm.

An example of the plasma treatment process includes providing ammonia to a processing chamber at a flow rate of about 700 sccm, providing helium to a processing chamber at a flow rate of about 1200 sccm, maintaining a chamber pressure at about 4.2 Torr, maintaining a heater temperature of about 350° C., positioning a gas distributor, or "showerhead", at about 350 mils, and generating a plasma by applying a RF power level of about 300 W at a high frequency of 13.56 MHz, for about 20 seconds.

Another example of the plasma treatment process includes providing ammonia to a processing chamber at a flow rate of about 160 sccm, providing nitrogen to a processing chamber at a flow rate of about 18000 sccm, maintaining a chamber pressure at about 4.2 Torr, maintaining a heater temperature of about 350° C., positioning a gas distributor, or "showerhead", at about 350 mils, and generating a plasma by applying a RF power level of about 300 W at a high frequency of 13.56 MHz, for about 20 seconds.

Another example of the plasma treatment process includes providing ammonia to a processing chamber at a flow rate of about 75 sccm, providing nitrogen to a processing chamber at a flow rate of about 5000 sccm, maintaining a chamber pressure at about 4.2 Torr, maintaining a heater temperature of about 350° C., positioning a gas distributor, or "showerhead", at about 350 mils, and generating a plasma by applying a RF power level of about 150 W at a high frequency of 13.56 MHz, for about 15 seconds.

A nitrated layer 130 may be deposited on the substrate and conductive material exposed thereon by introducing an organosilicon compound into the processing chamber in the presence of the reducing gas as shown in FIG. 2A. This may be achieved by introducing the organosilicon compound into the processing chamber during or immediately following the plasma treatment for in situ deposition, which organosilicon compound may react with the nitrogen from the reducing gas to form a nitrated layer, for example, a nitrogen doped silicon carbide (SiCN:H) or a nitrogen doped silicon oxycarbide (SiCON:H). The reducing compound may be supplied with the organosilicon compound or the organosilicon compound may react with residual amounts of the reducing compound from the plasma treatment. The reaction between the reducing compound and the organosilicon compound may be a thermally or plasma enhanced deposition process. Examples of suitable organosilicon compounds include trimethylsilane (TMS) and dimethylphenyl silane (DMPS).

One embodiment of a deposition of nitrated silicon carbide layer 130 comprises introducing an organosilicon precursor at a flow rate between about 10 sccm and about 1000 sccm, for example, between about 50 sccm and about 500 sccm, providing reducing compounds to a processing chamber at a flow rate between about 100 sccm and about 2500 sccm, for example, between about 500 sccm and about 2000 sccm, and optionally, supplying a noble gas at a flow rate between about 1 sccm and about 10,000 sccm, maintaining a chamber pressure between about 100 milliTorr and about 100 Torr, for example, between about 2.5 Torr and about 9 Torr, maintaining a heater temperature between about 100° C. and about 500° C., for example, between about 250° C. and about 450° C., positioning a gas distributor, or "showerhead", between about 200 mils and about 1000 mils, for example between 200 mils and 400 mils from the substrate surface, and optionally, generating a plasma.

The plasma may be generated by applying a power density ranging between about 0.03 W/cm$^2$ and about 6.4 W/cm$^2$, which is a RF power level of between about 10 W and about 2000 W for a 200 mm substrate, for example, between about 500 W and about 1100 W at a high frequency such as between 13 MHz and 14 MHz, for example, 13.56 MHz. The plasma may be generated by applying a power density ranging between about 0.01 W/cm$^2$ and about 2.8 W/cm$^2$, which is a RF power level of between about 10 W and about 2000 W for a 300 mm substrate, for example, between about 500 W and about 1100 W at a high frequency such as between 13 MHz and 14 MHz, for example, 13.56 MHz.

The power may be applied from a dual-frequency RF power source a first RF power with a frequency in a range of about 10 MHz and about 30 MHz at a power in a range of about 200 watts to about 1000 watts and at least a second RF power with a frequency in a range of between about 100 KHz and about 500 KHz as well as a power in a range of about 1 watt to about 200 watts. The initiation layer may be deposited for a period of time between about 1 second and 60 seconds, for example between about 1 and about 5 seconds, such as 2 seconds.

An example of a deposition of nitrated layer 130 comprises introducing ammonia at a flow rate of 700 sccm into the processing chamber, introducing helium at a flow rate of 1200 sccm into the processing chamber, introducing trimethylsilane (TMS) at a flow rate of about 350 sccm, maintaining the chamber at a heater temperature of about 350° C., maintaining a chamber pressure of about 3.7 Torr, positioning a gas distributor at about 280 mils from the substrate surface, and applying a RF power of about 900 watts at 13.56 MHz.

The subsequent silicon carbide layer 132 may be deposited as described herein, and, for example, continuously introducing the organosilicon compound described above or by adjusting the silicon carbide precursor gas flow rates and any dopants, carrier gases, or other compounds as described herein to deposit a silicon carbide layer having desired properties. The continuous flow of organosilicon precursor during or immediately following the reducing compound treatment process allows for the removal of oxides, the formation of a nitrated layer and deposition of the silicon carbide layer to be performed in situ. An example of the deposition process is provided by Example #2 disclosed herein.

Additionally, process gas stabilization steps may be performed between plasma treatment process and deposition processes as well as between deposition processes. Such stabilization steps generally include plasma-free processes with a new plasma generated as needed for the treatment or deposition process.

Optionally, a post-deposition plasma treatment of all of the deposited silicon carbide materials described herein, including nitrogen doped silicon carbide materials described herein, may be performed to enhance the properties of the deposited materials or to remove contaminants or other wise clean the exposed surface of the silicon carbide layer prior to subsequent deposition of materials thereon. The post-deposition plasma treatment may be performed in situ with the deposition process.

A post-deposition plasma treatment of an inert gas, a reducing gas, or a combination thereof may be applied. The plasma inert gas includes helium, argon, neon, xenon, krypton, or combinations thereof, of which helium is preferred. The reducing gas includes hydrogen, ammonia, or combinations thereof, of which ammonia is preferred. The post-deposition plasma treatment may be a product of a plasma purge step in which all gases but one is discontinued while exhausting the process chamber.

An example of a post-deposition plasma treatment includes introducing ammonia at a flow rate of 950 sccm into the processing chamber, maintaining the chamber at a heater temperature of about 350 °C., maintaining a chamber pressure of about 3.7 Torr, positioning a gas distributor at about 280 mils from the substrate surface, and applying a RF power of about 300 watts at 13.56 MHz for about two seconds.

In one embodiment of the plasma treatment and deposition process, a plasma of an organosilicon compound, such as trimethylsilane, may be performed after the plasma treatment and before the deposition process. The plasma of the organosilicon compound is believed to form a silicide layer on the plasma treated surface to provide improved adhesion for the deposited silicon carbide layer. The processing steps including the plasma of the organosilicon modified process include for example, exposing the substrate surface to a plasma treatment as described herein, a stabilization step for the organosilicon compound, generating a plasma of the organosilicon compound, and then deposition of a nitrogen doped silicon carbide.

One example of the plasma of the organosilicon compound comprises providing organosilicon compounds to a processing chamber at a flow rate between about 50 sccm and about 1500 sccm, for example, between about 400 sccm and about 500 sccm, optionally providing an inert gas, such as helium, to a processing chamber at a flow rate between about 100 sccm and about 20000 sccm, for example, between about 800 sccm and about 1500 sccm, maintaining a chamber pressure between about 1 Torr and about 12 Torr, for example, between about 2.5 Torr and about 9 Torr, maintaining a heater temperature between about 100° C. and about 500° C., for example, between about 250° C. and about 450° C., positioning a gas distributor, or "showerhead", between about 200 mils and about 1000 mils, for example between 300 mils and 500 mils from the substrate surface, and generating a plasma. The plasma treatment may be performed between about 1 second and about 10 seconds, for example, between about 1 second and about 5 seconds preferably used.

The plasma may be generated by applying a power density ranging between about 0.03 W/cm$^2$ and about 3.2 W/cm$^2$, which is a RF power level of between about 10 W and about 1000 W for a 200 mm substrate, for example, between about 100 W and about 400 W at a high frequency such as between 13 MHz and 14 MHz, for example, 13.56 MHz. The plasma may be generated by applying a power density ranging between about 0.01 W/cm$^2$ and about 1.4 W/cm$^2$, which is a RF power level of between about 10 W and about 1000 W for a 300 mm substrate, for example, between about 100 W and about 400 W at a high frequency such as between 13 MHz and 14 MHz, for example, 13.56 MHz. Alternatively, the plasma may be generated by a dual-frequency RF power source as described herein. Alternatively, all plasma generation may be performed remotely, with the generated radicals introduced into the processing chamber for plasma treatment of a deposited material or deposition of a material layer. An example is provided by Example #3 disclosed herein.

In another embodiment of the plasma treatment and deposition process, a silicon nitride layer may be deposited by an organosilicon compound, such as trimethylsilane, after the plasma treatment and before the deposition process. The processing steps include, for example, exposing the substrate surface to a plasma treatment as described herein, a stabilization step for the silicon nitride deposition process, depositing the silicon nitride layer, a stabilization step for the nitrogen doped silicon carbide deposition process, and then deposition of a nitrogen doped silicon carbide compound. The silicon nitride material may be carbon doped silicon nitride.

One example of the silicon nitride deposition process comprises providing organosilicon compounds to a processing chamber at a flow rate between about 50 sccm and about 1000 sccm, for example, between about 250 sccm and about 500 sccm, providing a nitrogen-containing compound, such as the reducing compounds described herein, to a processing chamber at a flow rate between about 500 sccm and about 2500 sccm, for example, between about 1250 sccm and about 1750 sccm optionally providing an inert gas, such as helium or nitrogen, to a processing chamber at a flow rate between about 100 sccm and about 20000 sccm, for example, between about 15000 sccm and about 19000 sccm, maintaining a chamber pressure between about 1 Torr and about 12 Torr, for example, between about 2.5 Torr and about 9 Torr, maintaining a heater temperature between about 100° C. and about 500° C., for example, between about 250° C. and about 450° C., positioning a gas distributor, or "showerhead", between about 200 mils and about 1000 mils, for example between 300 mils and 500 mils from the substrate surface, and generating a plasma. The plasma treatment may be performed between about 1 second and about 10 seconds, for example, between about 1 second and about 5 seconds preferably used.

The plasma may be generated by applying a power density ranging between about 0.03 W/cm$^2$ and about 6.4 W/cm$^2$, which is a RF power level of between about 10 W and about 1200 W for a 200 mm substrate, for example, between about 100 W and about 400 W at a high frequency such as between 13 MHz and 14 MHz, for example, 13.56 MHz. The plasma may be generated by applying a power density ranging between about 0.01 W/cm$^2$ and about 2.8 W/cm$^2$, which is a RF power level of between about 10 W and about 2000 W for a 300 mm substrate, for example, between about 100 W and about 400 W at a high frequency such as between 13 MHz and 14 MHz, for example, 13.56 MHz. Alternatively, the plasma may be generated by a dual-frequency RF power source as described herein. Alternatively, all plasma generation may be performed remotely, with the generated radicals introduced into the processing chamber for plasma treatment of a deposited material or deposition of a material layer. An example is provided by Example #4 disclosed herein.

Silicide Formation

Figure 3A:
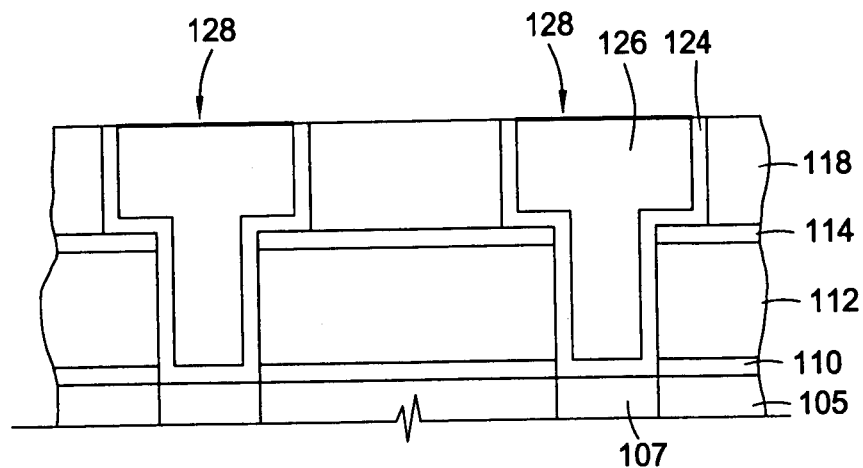
FIGS. 3A–3C are cross-sectional views showing one embodiment of a improved interlayer adhesion sequence of the invention.
Figure 3B:
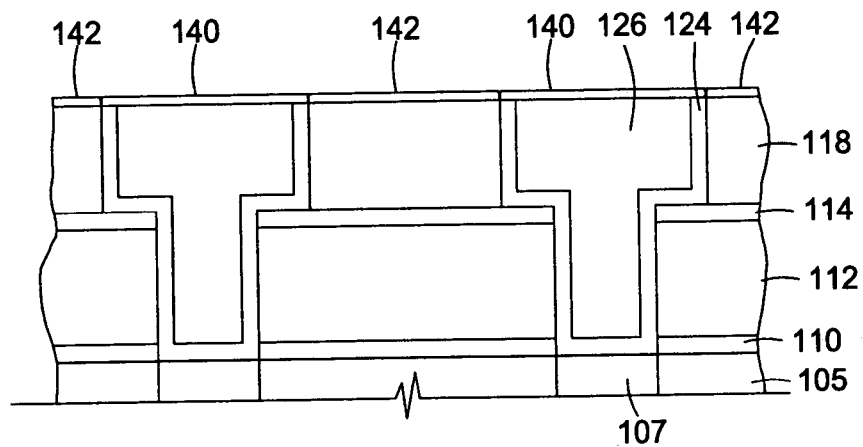
Figure 3C:
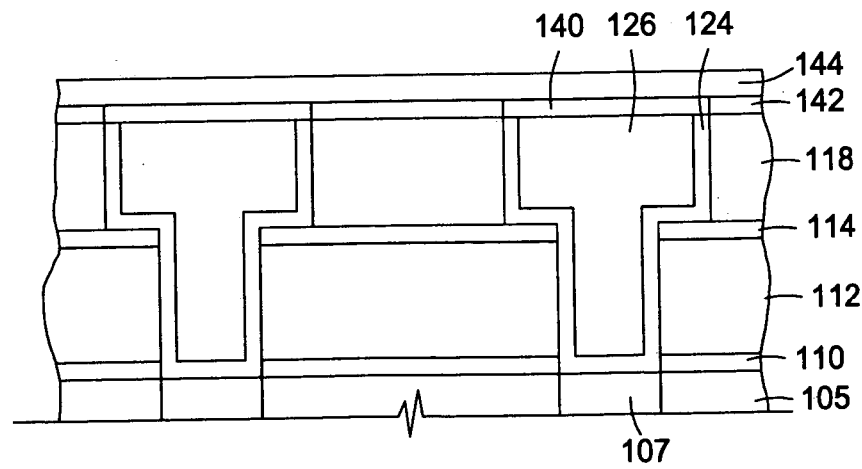

Referring to FIGS. 3A–3C, in another embodiment of the treatment and deposition process described herein, interlayer adhesion may be improved by introducing a silicon based compound, over a substrate having a conductive material 126 as shown on FIG. 3A with may have oxidized portions 128, and then reacting the silicon based compound with the conductive material to form a silicide 142 over the conductive materials 140 as shown in FIG. 3B. Silicon deposition 142 may occur on dielectric materials during silicide formation. An organosilicon compound may then be introduced into the processing chamber and a silicon carbide layer 144 deposited on the silicide layers 142 and surface of the substrate as shown in FIG. 3C. Dopants, such as nitrogen containing compounds, including ammonia, may be used to form nitrosilicides with the conductive material. Additionally, suitable silicon based compounds, such as silane ($SiH_4$), may additionally perform as a reducing compound to remove any oxides formed on the conductive materials. Further, an inert plasma treatment may be performed on the substrate surface prior to introducing the silicon based compound.

The silicon based compound may comprise a carbon-free silicon compound including silane, disilane, and derivatives thereof. The silicon based compound may also comprise a carbon-containing silicon compound including organosilicon compounds described herein, for example, trimethylsilane (TMS) and/or dimethylphenyl silane (DMPS). The silicon based compound may react with the exposed conductive material by thermally and/or plasma enhanced process. Dopants, such as oxygen and nitrogen may used with the silicon based compound as describe herein. Additionally, an inert gas, such as a noble gas including helium and argon may be used during the silicide process, and is preferably used as a carrier gas for the thermal process or as an additional plasma species for the plasma enhanced silicide formation process. The silicon containing compound may further include a dopant, such as the reducing compound described herein, to form a nitrosilicide. In such an embodiment, the reducing compound may be delivered as described herein.

One example of a silicide process with the silicon based compounds described herein includes providing silicon based compounds to a processing chamber at a flow rate between about 10 sccm and about 1000 sccm, for example, between about 75 sccm and about 200 sccm, maintaining a chamber pressure between about 1 Torr and about 12 Torr, for example, between about 2.5 Torr and about 9 Torr, maintaining a heater temperature between about 100° C. and about 500° C., for example, between about 250° C. and about 450° C., positioning a gas distributor, or "showerhead", between about 200 mils and about 1000 mils, for example between 200 mils and 400 mils from the substrate surface.

The silicide formation process may be further enhanced by generating a plasma. The plasma may be generated by applying a power density ranging between about 0.03 W/cm$^2$ and about 6.4 W/cm$^2$, which is a RF power level of between about 10 W and about 2000 W for a 200 mm substrate, for example, between about 100 W and about 400 W at a high frequency such as between 13 MHz and 14 MHz, for example, 13.56 MHz. The plasma may be generated by applying a power density ranging between about 0.01 W/cm$^2$ and about 2.8 W/cm$^2$, which is a RF power level of between about 10 W and about 2000 W for a 300 mm substrate, for example, between about 100 W and about 400 W at a high frequency such as between 13 MHz and 14 MHz, for example, 13.56 MHz. Alternatively, the plasma may be generated by a dual-frequency RF power source as described herein. Alternatively, all plasma generation may be performed remotely, with the generated radicals introduced into the processing chamber for plasma treatment of a deposited material or deposition of a material layer. The plasma may be generated between about 1 second and about 60 seconds, for example, between about 1 second and about 5 seconds preferably used to form the silicide layer.

An example of the silicide process includes providing silane to a processing chamber at a flow rate of about 125 sccm, providing helium to a processing chamber at a flow rate of about 400 sccm, providing ammonia to a processing chamber at a flow rate of about 325 sccm, maintaining a chamber pressure at about 3 Torr, maintaining a heater temperature of about 350° C., positioning a gas distributor, or "showerhead", at about 300 mils, for about 2.5 seconds.

The subsequent silicon carbide layer may be deposited as described herein for silicon carbide deposition. The silicon carbide deposition may also be performed using the same carbon-containing silicon based compound for the silicide process, and may be performed in the same chamber. The silicon carbide layer may be exposed to a post-deposition plasma as described herein.

In one embodiment of the silicide formation process, a substrate is subjected to a plasma treatment of a reducing compound as described herein, exposed to the silicon containing compound to form the silicide, and then a nitrogen doped silicon carbide layer is deposited thereon. The processing steps may further include a stabilization step prior to the silicide formation process.

In another embodiment of the silicide process, a silicon nitride layer may be deposited after the suicide formation and before the deposition process. The processing steps include, for example, exposing the substrate surface to a plasma treatment as described herein, a stabilization step for the silicide formation, depositing the silicon nitride layer, and then deposition of a nitrogen doped silicon carbide layer. The processing steps may further include a stabilization step prior to the silicide formation process. The silicon nitride material may be carbon doped silicon nitride.

One example of the silicon nitride deposition process comprises providing silane to a processing chamber at a flow rate between about 50 sccm and about 1000 sccm, for example, between about 50 sccm and about 300 sccm, providing a nitrogen-containing compound, such as the reducing compounds described herein, to a processing chamber at a flow rate between about 10 sccm and about 1000 sccm, for example, between about 50 sccm and about 150 sccm, optionally providing an inert gas, such as helium or nitrogen, to a processing chamber at a flow rate between about 10 sccm and about 20000 sccm, for example, between about 2000 sccm and about 10000 sccm, maintaining a chamber pressure between about 1 Torr and about 12 Torr, for example, between about 2.5 Torr and about 9 Torr, maintaining a heater temperature between about 100° C. and about 500° C., for example, between about 250° C. and about 450° C., positioning a gas distributor, or "showerhead", between about 200 mils and about 1000 mils, for example between 300 mils and 600 mils from the substrate surface, and generating a plasma. The plasma may be generated between about 1 second and about 10 seconds, for example, between about 1 second and about 5 seconds.

The plasma may be generated by applying a power density ranging between about 0.03 W/cm² and about 6.4 W/cm², which is a RF power level of between about 10 W and about 2000 W for a 200 mm substrate, for example, between about 100 W and about 400 W at a high frequency such as between 13 MHz and 14 MHz, for example, 13.56 MHz. The plasma may be generated by applying a power density ranging between about 0.01 W/cm² and about 2.8 W/cm², which is a RF power level of between about 10 W and about 2000 W for a 300 mm substrate, for example, between about 100 W and about 400 W at a high frequency such as between 13 MHz and 14 MHz, for example, 13.56 MHz. Alternatively, the plasma may be generated by a dual-frequency RF power source as described herein. Alternatively, all plasma generation may be performed remotely, with the generated radicals introduced into the processing chamber for plasma treatment of a deposited material or deposition of a material layer.

An example of the silicon nitride deposition process includes providing silane to a processing chamber at a flow rate of about 220 sccm, providing nitrogen to a processing chamber at a flow rate of about 5000 sccm, providing ammonia to a processing chamber at a flow rate of about 75 sccm, maintaining a chamber pressure at about 4.2 Torr, maintaining a heater temperature of about 350° C., positioning a gas distributor, or "showerhead", at about 495 mils, and generating a plasma at a power level between about 440 watts and about 450 watts for about 2 seconds.

The subsequent silicon carbide layer may be deposited as described herein for silicon carbide deposition. The silicon carbide deposition may also be performed using the same carbon-containing silicon based compound for the silicide process, and may be performed in the same chamber.

EXAMPLES

The following examples demonstrate various embodiments of the adhesion processes described herein as compared to a standard interlayer stack to illustrate the improved interlayer adhesion. The samples were undertaken using a Producer™ 300 mm processing chambers, which includes a solid-state dual frequency RF matching unit with a two-piece quartz process kit, both fabricated and sold by Applied Materials, Inc., Santa Clara, Calif.

Test samples were prepared as follows. A stack of dielectric layers were deposited on a silicon substrate as follows. The substrate comprises a silicon substrate having about 1000 Å of silicon oxide disposed thereon, about 250 Å of tantalum disposed on the silicon oxide, about 4500 Å of copper disposed on the tantalum, and then the adhesion processes described herein were performed on the substrate, typically resulting in about 2000 Å of nitrogen doped silicon carbide disposed on the copper layer.

Adhesion testing was performed on the test samples as follows. Between about 120 μm and about 150 μm of epoxy material with known delamination characteristics were deposited on the test samples. A layer of silicon was deposited thereon. The test samples were then baked or cured for one hour at approximately 190° C. and then cleaved into 1 cm by 1 cm samples and cooled to −170° C. with liquid nitrogen. The samples were then observed to determine delamination, which occurs at a weakest interlayer interface at a given temperature. The shrinkage of the epoxy at a given temperature correlates to the forces that are required to induce peeling. From this observation, a determination of adhesion can be calculated. Adhesion ($G_C$) is based on the formula $\sigma_\sqrt{}(h/2)$, with h being the epoxy thickness and a being the residual stress.

For Example #1 the adhesion process includes an ammonia plasma treatment, followed by a stabilization process, and then nitrogen doped silicon carbide deposition on the substrate surface. The process was performed as follows.

The plasma treatment process includes providing ammonia to a processing chamber at a flow rate of about 160 sccm, providing nitrogen to a processing chamber at a flow rate of about 18000 sccm, maintaining a chamber pressure at about 4.2 Torr, maintaining a heater temperature of about 350° C., positioning a gas distributor, or "showerhead", at about 350 mils, and generating a plasma by applying a RF power level of about 300 W at a high frequency of 13.56 MHz, for about 20 seconds.

A stabilization process including providing trimethylsilane to a processing chamber at a flow rate of about 350 sccm, providing ammonia to a processing chamber at a flow rate of about 700 sccm, providing helium to a processing chamber at a flow rate of about 1200 sccm, maintaining a chamber pressure at about 3.7 Torr, maintaining a heater temperature of about 350° C., positioning a gas distributor, or "showerhead", at about 280 mils. The stabilization process may be performed for about 5 seconds. Depositing the nitrogen doped silicon carbide layer by initiating a plasma of the organosilicon compound by generating a plasma by applying a RF power level of about 900 W at a high frequency of 13.56 MHz, for about 63 seconds.

The measured adhesion $G_C$ of the substrate of Example #1 was about 3.8+/−0.6 J-m².

For Example #2 the adhesion process included an ammonia plasma treatment followed by forming a nitrated silicon carbide layer on the substrate surface. The process was performed as follows.

The plasma treatment process includes providing ammonia to a processing chamber at a flow rate of about 700 sccm, providing helium to a processing chamber at a flow rate of about 1200 sccm, maintaining a chamber pressure at about 4.2 Torr, maintaining a heater temperature of about 350° C., positioning a gas distributor, or "showerhead", at about 350 mils, and generating a plasma by applying a RF power level of about 300 W at a high frequency of 13.56 MHz, for about 20 seconds.

The nitrated layer was deposited by introducing ammonia at a flow rate of 700 sccm into the processing chamber, introducing helium at a flow rate of 1200 sccm into the processing chamber, introducing trimethylsilane (TMS) at a flow rate of about 350 sccm, maintaining the chamber at a heater temperature of about 350° C., maintaining a chamber pressure of about 3.7 Torr, positioning a gas distributor at about 280 mils from the substrate surface, and applying a RF power of about 900 watts at 13.56 MHz.

The measured adhesion $G_C$ of the substrate of Example #2 was about 3.2+/−0.3 J-m².

For Example #3 the adhesion process includes an ammonia plasma treatment, followed by a stabilization process for an organosilicon plasma treatment, and then nitrogen doped silicon carbide deposition on the substrate surface. The process was performed as follows.

The plasma treatment process includes providing ammonia to a processing chamber at a flow rate of about 160 sccm, providing nitrogen to a processing chamber at a flow rate of about 18000 sccm, maintaining a chamber pressure at about 4.2 Torr, maintaining a heater temperature of about 350° C., positioning a gas distributor, or "showerhead", at about 350 mils, and generating a plasma by applying a RF power level of about 300 W at a high frequency of 13.56 MHz, for about 20 seconds.

A stabilization process including providing trimethylsilane to a processing chamber at a flow rate of about 450 sccm, providing helium to a processing chamber at a flow rate of about 1200 sccm, maintaining a chamber pressure at about 3.7 Torr, maintaining a heater temperature of about 350° C., positioning a gas distributor, or "showerhead", at about 280 mils, for about 5 seconds. Initiating a plasma of the organosilicon compound by generating a plasma by applying a RF power level of about 300 W at a high frequency of 13.56 MHz, for about 2 seconds.

The nitrogen doped silicon carbide layer is deposited by introducing ammonia at a flow rate of 700 sccm into the processing chamber, introducing helium at a flow rate of 1200 sccm into the processing chamber, introducing trimethylsilane (TMS) at a flow rate of about 350 sccm, maintaining the chamber at a heater temperature of about 350° C., maintaining a chamber pressure of about 3.7 Torr, positioning a gas distributor at about 280 mils from the substrate surface, and applying a RF power of about 900 watts at 13.56 MHz.

The measured adhesion $G_C$ of the substrate of Example #3 was about 4.0+/−0.2 J-m².

For Example #4 the adhesion process includes an ammonia plasma treatment, a stabilization process for nitride deposition, nitride deposition of about 100 Å, a stabilization process for nitride deposition for nitrogen doped silicon carbide, and then nitrogen doped silicon carbide deposition on the substrate surface. The process was performed as follows.

The plasma treatment process includes a plasma treatment process of providing ammonia to a processing chamber at a flow rate of about 160 sccm, providing nitrogen to a processing chamber at a flow rate of about 18000 sccm, maintaining a chamber pressure at about 4.2 Torr, maintaining a heater temperature of about 350° C., positioning a gas distributor, or "showerhead", at about 350 mils, and generating a plasma by applying a RF power level of about 300 W at a high frequency of 13.56 MHz, for about 20 seconds.

A stabilization process including providing trimethylsilane to a processing chamber at a flow rate of about 350 sccm, providing ammonia to a processing chamber at a flow rate of about 1500 sccm, providing nitrogen to a processing chamber at a flow rate of about 18000 sccm, maintaining a chamber pressure at about 3.7 Torr, maintaining a heater temperature of about 350° C., positioning a gas distributor, or "showerhead", at about 280 mils, for about 5 seconds. Depositing the silicon nitride (carbon doped) layer by initiating a plasma of the organosilicon compound by generating a plasma by applying a RF power level of about 900 W at a high frequency of 13.56 MHz, for between about 2 seconds and about 3 seconds.

A stabilization process including providing trimethylsilane to a processing chamber at a flow rate of about 350 sccm, providing ammonia to a processing chamber at a flow rate of about 700 sccm, providing helium to a processing chamber at a flow rate of about 1200 sccm, maintaining a chamber pressure at about 3.7 Torr, maintaining a heater temperature of about 350° C., positioning a gas distributor, or "showerhead", at about 280 mils, for about 5 seconds. Depositing the nitrogen doped silicon carbide layer by Initiating a plasma of the organosilicon compound by generating a plasma by applying a RF power level of about 900 W at a high frequency of 13.56 MHz, for about 60 seconds.

The measured adhesion $G_C$ of the substrate of Example #4 was about 2.9+/−0.3 J-m².

For Example #5 the adhesion process includes silicide process including an ammonia plasma treatment, a stabilization process for silicide formation, silicide formation, and then nitrogen doped silicon carbide deposition on the substrate surface. The process was performed as follows.

The plasma treatment process includes providing ammonia to a processing chamber at a flow rate of about 75 sccm, providing nitrogen to a processing chamber at a flow rate of about 5000 sccm, maintaining a chamber pressure at about 4.2 Torr, maintaining a heater temperature of about 350° C., positioning a gas distributor, or "showerhead", at about 350 mils, and generating a plasma by applying a RF power level of about 150 W at a high frequency of 13.56 MHz, for about 15 seconds.

A stabilization process including providing ammonia to a processing chamber at a flow rate of about 325 sccm, providing helium to a processing chamber at a flow rate of about 400 sccm, maintaining a chamber pressure at about 3 Torr, maintaining a heater temperature of about 350° C., positioning a gas distributor, or "showerhead", at about 300 mils, for about 10 seconds.

Forming the silicide by providing silane to a processing chamber at a flow rate of about 125 sccm, providing helium to a processing chamber at a flow rate of about 400 sccm, providing ammonia to a processing chamber at a flow rate of about 325 sccm, maintaining a chamber pressure at about 3 Torr, maintaining a heater temperature of about 350° C., positioning a gas distributor, or "showerhead", at about 300 mils, for about 2.5 seconds.

The nitrogen doped silicon carbide may be deposited by providing trimethylsilane to a processing chamber at a flow rate of about 160 sccm, providing ammonia to a processing chamber at a flow rate of about 325 sccm, providing helium to a processing chamber at a flow rate of about 400 sccm, maintaining a chamber pressure at about 3 Torr, maintaining a heater temperature of about 350° C., positioning a gas distributor, or "showerhead", at about 300 mils, and generating a plasma by applying a RF power level between about 300 and about 310 W at a high frequency of 13.56 MHz, for about 76 seconds.

The measured adhesion $G_C$ of the substrate of Example #4 was about 3.9+/−0.5 J-m².

For Example #6 the adhesion process includes silicide process including an ammonia plasma treatment, a stabilization process for silicide formation, silicide formation, a deposition of about 100 Å of silicon nitride, and then nitrogen doped silicon carbide deposition on the substrate surface. The process was performed as follows.

The plasma treatment process includes providing ammonia to a processing chamber at a flow rate of about 75 sccm, providing nitrogen to a processing chamber at a flow rate of about 5000 sccm, maintaining a chamber pressure at about 4.2 Torr, maintaining a heater temperature of about 350° C., positioning a gas distributor, or "showerhead", at about 350 mils, and generating a plasma by applying a RF power level of about 150 W at a high frequency of 13.56 MHz, for about 15 seconds.

A stabilization process including providing ammonia to a processing chamber at a flow rate of about 75 sccm, providing nitrogen to a processing chamber at a flow rate of about 5000 sccm, maintaining a chamber pressure at about 4.2 Torr, maintaining a heater temperature of about 350° C., positioning a gas distributor, or "showerhead", at about 495 mils, for about 5 seconds. Forming the silicide by providing silane to a processing chamber at a flow rate of about 125 sccm, for about 2.5 seconds.

The silicon nitride is deposited by providing silane to a processing chamber at a flow rate of about 220 sccm, providing ammonia to a processing chamber at a flow rate of about 75 sccm, providing nitrogen to a processing chamber at a flow rate of about 5000 sccm, maintaining a chamber pressure at about 4.2 Torr, maintaining a heater temperature of about 350° C., positioning a gas distributor, or "showerhead", at about 495 mils, and generating a plasma by applying a RF power level between about 440 and about 450 W at a high frequency of 13.56 MHz, for about 2 seconds.

The nitrogen doped silicon carbide may be deposited by providing trimethylsilane to a processing chamber at a flow rate of about 160 sccm, providing ammonia to a processing chamber at a flow rate of about 325 sccm, providing helium to a processing chamber at a flow rate of about 400 sccm, maintaining a chamber pressure at about 3 Torr, maintaining a heater temperature of about 350° C., positioning a gas distributor, or "showerhead", at about 300 mils, and generating a plasma by applying a RF power level between about 300 and about 310 W at a high frequency of 13.56 MHz, for about 72 seconds.

The measured adhesion $G_C$ of the substrate of Example #4 was about 5.3 J-m$^2$.

Layer Deposition:

The silicon carbide layer is deposited by reacting an organosilicon compound to form a dielectric layer comprising carbon-silicon bonds and a dielectric constant less than about 4. The silicon carbide layer is preferably an amorphous hydrogenated silicon carbide. The silicon carbide layer may be deposited in a plasma of an inert gas, hydrogen gas, or both. The silicon carbide dielectric layer may be a doped silicon carbide layer. The silicon carbide layer may be deposited as a barrier layer disposed adjacent a conductive material or dielectric layer or may be an etch stop deposited between one or more dielectric layers.

Examples of suitable organosilicon compounds used herein for silicon carbide deposition preferably include the structure:

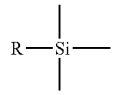

wherein R includes organic functional groups including alkyl, alkenyl, cyclohexenyl, and aryl groups, in addition to functional derivatives thereof. The organic precursors may have more than one R group attached to the silicon atom, and the invention contemplates the use of organosilicon precursors with or without Si—H bonds.

The organosilicon compounds include aliphatic organosilicon compounds, cyclic organosilicon compounds, or combinations thereof, having at least one silicon-carbon bond, and optionally, the structure may include oxygen. Cyclic organosilicon compounds typically have a ring comprising three or more silicon atoms. Aliphatic organosilicon compounds have linear or branched structures comprising one or more silicon atoms and one or more carbon atoms. Commercially available aliphatic organosilicon compounds include organosilanes that do not contain oxygen between silicon atoms, and for oxygen doped silicon carbide layer, organosiloxanes that contain oxygen between two or more silicon atoms. Fluorinated derivatives of the organosilicon compounds described herein may also be used to deposit the silicon carbide and silicon oxycarbide layers described herein.

Examples of suitable aliphatic and cyclic organosilicon compounds include, for example, one or more of the following compounds:

| | |
|---|---|
| Methylsilane, | CH$_3$—SiH$_3$ |
| Dimethylsilane, | (CH$_3$)$_2$—SiH$_2$ |
| Trimethylsilane (TMS), | (CH$_3$)$_3$—SiH |
| Ethylsilane, | CH$_3$—CH$_2$—SiH$_3$ |
| Disilanomethane, | SiH$_3$—CH$_2$—SiH$_3$ |
| Bis(methylsilano)methane, | CH$_3$—SiH$_2$—CH$_2$—SiH$_2$—CH$_3$ |
| 1,2-disilanoethane, | SiH$_3$—CH$_2$—CH$_2$—SiH$_3$ |
| 1,2-bis(methylsilano)ethane, | CH$_3$—SiH$_2$—CH$_2$—CH$_2$—SiH$_2$—CH$_3$ |
| 2,2-disilanopropane, | SiH$_3$—C(CH$_3$)$_2$—SiH$_3$ |
| 1,3,5-trisilano-2,4,6-trimethylene, | —(—SiH$_2$—CH$_2$—)$_3$— (cyclic) |
| Diethylsilane | (C$_2$H$_5$)$_2$SiH$_2$ |
| Propylsilane | C$_3$H$_7$SiH$_3$ |
| Vinylmethylsilane | (CH$_2$=CH)(CH$_3$)SiH$_2$ |
| Divinyldimethylsilane (DVDMS) | (CH$_2$=CH)$_2$(CH$_3$)$_2$Si |
| 1,1,2,2-tetramethyldisilane | HSi(CH$_3$)$_2$—Si(CH$_3$)$_2$H |
| Hexamethyldisilane | (CH$_3$)$_3$Si—Si(CH$_3$)$_3$ |
| 1,1,2,2,3,3-hexamethyltrisilane | H(CH$_3$)$_2$Si—Si(CH$_3$)$_2$—SiH(CH$_3$)$_2$ |
| 1,1,2,3,3-pentamethyltrisilane | H(CH$_3$)$_2$Si—SiH(CH$_3$)—SiH(CH$_3$)$_2$ |
| Dimethyldisilanoethane | CH$_3$—SiH$_2$—(CH$_2$)$_2$—SiH$_2$—CH$_3$ |
| Dimethyldisilanopropane | CH$_3$—SiH$_2$—(CH$_2$)$_3$—SiH$_2$—CH$_3$ |
| Tetramethyldisilanoethane | (CH)$_2$—SiH—(CH$_2$)$_2$—SiH—(CH)$_2$ |
| Tetramethyldisilanopropane | (CH$_3$)$_2$—SiH—(CH$_2$)$_3$—SiH—(CH$_3$)$_2$ |

The above list is illustrative and should not be construed or interpreted as limiting the scope of the invention.

Phenyl containing organosilicon compounds may also be used for depositing the silicon carbide materials and generally include the structure:

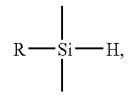

wherein R is a phenyl group. For example, suitable phenyl containing organosilicon compounds generally includes the formula SiH$_a$(CH$_3$)$_b$(C$_6$H$_5$)$_c$, wherein a is 0 to 3, b is 0 to 3, and c is 1 to 4, and a+b+c is equal to 4. Examples of suitable precursors derived from this formula include diphenylsilane, dimethylphenylsilane, diphenylmethylsilane, phenylmethylsilane, and combinations thereof. Preferably used are phenyl containing organosilicon compounds with b is 1 to 3 and c is 1 to 3. The most preferred organosilicon compounds for deposition as barrier layer materials include organosilicon compounds having the formula SiH$_a$(CH$_3$)$_b$(C$_6$H$_5$)$_c$, wherein a is 1 or 2, b is 1 or 2, and c is 1 or 2. Examples of preferred precursors include dimethylphenylsilane and diphenylmethylsilane.

Generally, the organosilicon compounds are reacted in a plasma comprising a relatively inert gas, such as nitrogen (N$_2$) and noble gases, such as helium or argon. The deposited silicon carbide layers have dielectric constants of about 5 or less, and the doped silicon carbide layers may have dielectric constants of about 3 or less. The processing gas may also include hydrogen gas. The hydrogen gas is generally added at a molar ratio of organosilicon compound to hydrogen gas of between about 1:1 and about 10:1, such as between about 1:1 and about 6:1, Preferred deposition processes for organosilicon compounds and hydrogen gas has a molar ratio of organosilicon compound to hydrogen gas of between about 1:1 and about 1.5:1.

A preferred silicon carbide layer is deposited in one embodiment by supplying trimethylsilane to a plasma processing chamber at a flow rate between about 10 milligrams/min (mgm) and about 5000 milligrams/min (mgm). Since conversion of milligram/minutes to standard cubic centimeters per minute (sccm) may vary between organosilicon compounds, milligrams/min is preferably used for organosilicon compounds. An inert gas, such as helium, argon, or combinations thereof, is also supplied to the chamber at a flow rate between about 50 sccm and about 5000 sccm. The chamber pressure is maintained between about 100 milliTorr and about 15 Torr. The substrate surface temperature is maintained between about 100° C. and about 450° C. during the deposition process. An example process for depositing a silicon carbide layer is disclosed in U.S. Pat. No. 6,537,733, issued on Mar. 25, 2003, which is incorporated by reference to the extent not inconsistent with the claims and disclosure described herein.

The silicon carbide layer may also be a doped silicon carbide layer containing oxygen, nitrogen, boron, phosphorus, or combinations thereof. Doped silicon carbide generally includes less than about 15 atomic percent (atomic %) or less of one or more dopants. Dopants may be used in the processing gases at a ratio of dopant to organosilicon compound between about 1:5 or greater, such as between about 1:5 and about 1:100.

An oxygen source or a nitrogen source may be used during the reaction to form the oxygen doped and/or nitrogen doped silicon carbide layers. Examples of oxygen sources include oxidizing gases, such as oxygen, ozone, carbon monoxide, carbon dioxide, nitrous oxide, and oxygen containing organosilicon precursor, or combinations thereof, such as carbon monoxide and an oxygen containing organosilicon precursor. Oxygen doped silicon carbide generally includes less than about 15 atomic percent (atomic %) of oxygen, preferably about 10 atomic % or less of oxygen.

The oxygen containing organosilicon compounds include, for example:

Nitrogen doped silicon carbide may comprise up to 20 atomic % of nitrogen and may be deposited by the addition of nitrogen containing compounds including, for example, ammonia, nitrogen gas, a mixture of nitrogen and hydrogen gas, and compounds having Si—N—Si bonding groups, such as silazane compounds. Examples of suitable silazane precursors include aliphatic compounds, such as hexamethyidisilazane and divinyltetramethyldisilizane, as well as cyclic compounds, such as hexamethylcyclotrisilazane.

For example, a doped silicon carbide layer can be deposited by introducing an oxygen source and/or a nitrogen source, or other dopant, into the processing chamber at a flow rate between about 50 sccm and about 10,000 sccm. For example, a nitrogen containing or nitrogen doped silicon carbide layer may be deposited by introducing a nitrogen source, such as ammonia, nitrogen, a mixture of nitrogen and hydrogen, or combinations thereof, during deposition of the silicon carbide layer.

Phosphorus and/or boron doping of the low k silicon carbide layer may be performed by introducing phosphine ($PH_3$) or borane ($BH_3$), or borane derivative thereof, such as diborane ($B_2H_6$), into the chamber during the deposition process. It is believed that dopants may reduce the dielectric constant of the deposited silicon carbide material. Phosphorus and/or boron dopants may be introduced into the processing chamber at a flow rate between about 50 sccm and about 10,000 sccm.

Organic compounds, such as aliphatic hydrocarbon compounds may also be used in the processing gas to increase the carbon content of the deposited silicon carbide materials. Suitable aliphatic hydrocarbon compounds include compounds having between one and about 20 adjacent carbon atoms. The hydrocarbon compounds can include adjacent carbon atoms that are bonded by any combination of single, double, and triple bonds.

Example processes for depositing a nitrogen containing silicon carbide layer is disclosed in U.S. patent application Ser. No. 09/627,667, filed on Jul. 28, 2000, Feb. 23, 2001, and U.S. Pat. Ser. No. 6,537,733, issued on Mar. 25, 2003, which are incorporated by reference to the extent not inconsistent with the claims and disclosure described herein. An example process for depositing an oxygen containing silicon carbide layer is disclosed in U.S. patent application Ser. No. 10/196,498, filed on Jul. 15, 2002, which is incorporated by reference to the extent not inconsistent with the claims and disclosure described herein. An example process for depositing a boron and/or phosphorus silicon carbide layer is disclosed in U.S. patent application Ser. No. 10/342,079,

| | |
|---|---|
| Dimethyldimethoxysilane, (DMDMOS) | $(CH_3)_2$—Si—$(OCH_3)_2$ |
| Diethoxymethylsilane (DEMS), | $(CH_3)$—SiH—$(OCH_3)_2$, |
| 1,3-dimethyldisiloxane, | $CH_3$—$SiH_2$—O—$SiH_2$—$CH_3$ |
| 1,1,3,3-tetramethyldisiloxane (TMDSO), | $(CH_3)_2$—SiH—O—SiH—$(CH_3)_2$ |
| Hexamethyldisiloxane (HMDS), | $(CH_3)_3$—Si—O—Si—$(CH_3)_3$ |
| Hexamethoxydisiloxane (HMDSO), | $(CH_3O)_3$—Si—O—Si—$(OCH_3)_3$, |
| 1,3-bis(silanomethylene)disiloxane, | $(SiH_3$—$CH_2$—$SiH_2$—$)_2$—O |
| Bis(1-methyldisiloxanyl)methane, | $(CH_3$—$SiH_2$—O—$SiH_2$—$)_2$—$CH_2$ |
| 2,2-bis(1-methyldisiloxanyl)propane, | $(CH_3$—$SiH_2$—O—$SiH_2$—$)_2$—$C(CH_3)_2$ |
| 1,3,5,7-tetramethylcyclotetrasiloxane (TMCTS) | —(—$SiHCH_3$—O—$)_4$— (cyclic) |
| octamethylcyclotetrasiloxane (OMCTS), | —(—$Si(CH_3)_2$—O—$)_4$— (cyclic) |
| 2,4,6,8,10-pentamethylcyclopentasiloxane, | —(—$SiHCH_3$—O—$)_5$— (cyclic) |
| 1,3,5,7-tetrasilano-2,6-dioxy-4,8-dimethylene, | —(—$SiH_2$—$CH_2$—$SiH_2$—O—$)_2$— (cyclic) |
| Hexamethylcyclotrisiloxane | —(—$Si(CH_3)_2$—O—$)_3$— (cyclic) |
| 1,3-dimethyldisiloxane, | $CH_3$—$SiH_2$—O—$SiH_2$—$CH_3$ |
| hexamethoxydisiloxane (HMDOS) | $(CH_3O)_3$—Si—O—Si—$(OCH_3)_3$. |
| and fluorinated derivatives thereof. | | filed on Jan. 13, 2003, which is incorporated by reference to the extent not inconsistent with the claims and disclosure described herein.

Generally, the organosilicon compound, inert gas, and optional dopant, are introduced to the processing chamber via a gas distribution plate spaced between about 200 millimeters (mm) and about 600 millimeters from the substrate on which the silicon carbide layer is being deposited.

Power may be applied for a single or dual frequency RF power source. For example, the plasma may be generated by applying a power density ranging between about 0.03 W/cm$^2$ and about 6.4 W/cm$^2$, which is a RF power level of between about 10 W and about 2000 W for a 200 mm substrate, for example, between about 500 W and about 1100 W at a high frequency such as between 13 MHz and 14 MHz, for example, 13.56 MHz. The plasma may be generated by applying a power density ranging between about 0.01 W/cm$^2$ and about 2.8 W/cm$^2$, which is a RF power level of between about 10 W and about 2000 W for a 300 mm substrate, for example, between about 500 W and about 1100 W at a high frequency such as between 13 MHz and 14 MHz, for example, 13.56 MHz.

The power may be applied from a dual-frequency RF power source. A dual-frequency source of mixed RF power provides a high frequency power in a range between about 10 MHz and about 30 MHz, for example, about 13.56 MHz, as well as a low frequency power in a range of between about 100 KHz and about 500 KHz, for example, about 350 KHz. An example of a mixed frequency RF power application may include a first RF power with a frequency in a range of about 10 MHz and about 30 MHz at a power in a range of about 200 watts to about 1000 watts and at least a second RF power with a frequency in a range of between about 100 KHz and about 500 KHz as well as a power in a range of about 1 watt to about 200 watts. The ratio of the second RF power to the total mixed frequency power is preferably less than about 0.2 to 1.0.

Additionally, the ratio of the silicon source to the dopant in the gas mixture should have a range between about 1:1 and about 100:1, The above process parameters provide a deposition rate for the silicon carbide layer in a range between about 100 Å/min and about 3000 Å/min when implemented on a 200 mm (millimeter) substrate in a deposition chamber available from Applied Materials, Inc., located in Santa Clara, Calif.

The embodiments described herein for depositing silicon carbide layers are provided to illustrate the invention, the particular embodiment shown should not be used to limit the scope of the invention. The invention also contemplates other processes and materials used to deposit silicon carbide layers.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising:
    positioning the substrate in a processing chamber, wherein the substrate comprises one or more patterned low k dielectric layers and a conductive material formed therein;
    introducing a reducing compound comprising nitrogen and hydrogen into the processing chamber;
    initiating a first plasma of the reducing compound in the processing chamber;
    exposing the conductive material to the first plasma of the reducing compound;
    terminating the first plasma and the reducing compound comprising nitrogen and hydrogen;
    introducing an organosilicon precursor in the processing chamber;
    initiating a second plasma of the organosilicon precursor in the processing chamber;
    introducing the reducing compound with the organosilicon precursor; and
    depositing a nitrogen doped silicon carbide dielectric material on the one or more patterned low k dielectric layers and conductive material without breaking vacuum.

2. The method of claim 1, wherein the reducing compound comprises ammonia or a mixture of nitrogen gas and hydrogen gas.

3. The method of claim 1, further comprising introducing an inert gas with the reducing compound.

4. The method of claim 1, wherein the organosilicon precursor is selected from the group of trimethylsilane, 2,4,6,8-tetramethylcyclotetrasiloxane, octamethylcyclotetrasiloxane, dimethylphenylsilane, diphenylmethylsilane, and combinations thereof.

5. The method of claim 1, further comprising introducing an inert gas, hydrogen gas, the reducing compound, or a combination thereof, with the organosilicon precursor.

6. The method of claim 1, wherein the initiating a plasma comprises generating a plasma by a single-frequency RF power source or a dual-frequency RF power source.

7. The method of claim 1, wherein the conductive material comprises copper, doped copper, or a copper alloy.

8. The method of claim 1, wherein the one or more patterned low k dielectric layers comprise silicon carbide, doped silicon carbide, silicon oxycarbide, or combinations thereof.

9. A method for processing a substrate, comprising:
    positioning the substrate in a processing chamber, wherein the substrate comprises one or more patterned low k dielectric layers and a conductive material formed therein;
    introducing a reducing compound comprising nitrogen and hydrogen at a first flow rate into the processing chamber;
    initiating a first plasma of the reducing compound in the processing chamber;
    exposing the conductive material to the plasma of the reducing compound;
    terminating the first plasma;
    introducing an organosilicon precursor in the processing chamber;
    introducing the reducing compound at a second flow rate greater than the first flow rate;
    initiating a second plasma of the organosilicon precursor and the reducing compound in the processing chamber;
    depositing a carbon doped silicon nitride dielectric material on the one or more patterned low k dielectric layers and conductive material;
    terminating the second plasma;
    introducing the organosilicon precursor in the processing chamber;
    introducing the reducing compound at a third flow rate less than the second flow rate;
    initiating a third plasma of the organosilicon precursor and the reducing compound in the processing chamber; and
    depositing a nitrogen doped silicon carbide dielectric material on the one or more patterned low k dielectric layers and conductive material without breaking vacuum.

* * * * *

UNITED STATES PATENT AND TRADEMARK OFFICE
CERTIFICATE OF CORRECTION

PATENT NO. : 7,229,911 B2
APPLICATION NO. : 10/929884
DATED : June 12, 2007
INVENTOR(S) : Rajagopalan et al.

It is certified that error appears in the above-identified patent and that said Letters Patent is hereby corrected as shown below:

In Column 2, Line 35, please delete "suicide" and insert --silicide--;

In Column 2, Line 36, please delete "suicide" and insert --silicide--;

In Column 3, Line 52, please delete "a" and insert --an--;

In Column 3, Line 55, please delete "a" and insert --an--;

In Column 11, Line 12, please delete "with" and insert --which--;

In Column 11, Line 37, please delete "may used" and insert --may be used--;

In Column 11, Line 38, please delete "describe" and insert --described--;

In Column 14, Line 3, please delete "a" and insert --$\sigma$--;

In Column 15, Line 65, please delete "Initiating" and insert --initiating--;

In Column 19, Line 3, please delete "6:1," and insert --6:1.--;

In Column 19, in the Table, Line 5, please delete "$(CH_3)_3$—Si—O—Si—$CH_3)_3$" and insert --$(CH_3)_3$—Si—O—Si—$(CH_3)_3$--;

In Column 20, Lines 7-8, please delete "hexamethyidisilazane" and insert --hexamethyldisilazane--;

In Column 20, Line 37, please delete "is" and insert --are--;

UNITED STATES PATENT AND TRADEMARK OFFICE
CERTIFICATE OF CORRECTION

PATENT NO. : 7,229,911 B2
APPLICATION NO. : 10/929884
DATED : June 12, 2007
INVENTOR(S) : Rajagopalan et al.

It is certified that error appears in the above-identified patent and that said Letters Patent is hereby corrected as shown below:

In Column 21, Line 38, please delete "100:1," and insert --l00:l.--.

Signed and Sealed this

Seventh Day of August, 2007

JON W. DUDAS
*Director of the United States Patent and Trademark Office*